(12) United States Patent
De Saulles et al.

(10) Patent No.: US 9,401,713 B2
(45) Date of Patent: Jul. 26, 2016

(54) KEYBOARD ASSEMBLY INCLUDING AN ELECTROMAGNET

(71) Applicant: Hewlett-Packard Development Company, L.P., Houston, TX (US)

(72) Inventors: Stephen Philip De Saulles, London (GB); Edward Thomas Rose, London (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/759,031

(22) PCT Filed: Jan. 4, 2013

(86) PCT No.: PCT/US2013/020190
§ 371 (c)(1),
(2) Date: Jul. 2, 2015

(87) PCT Pub. No.: WO2014/107155
PCT Pub. Date: Jul. 10, 2014

(65) Prior Publication Data
US 2015/0341030 A1    Nov. 26, 2015

(51) Int. Cl.
*H03K 17/94* (2006.01)
*H03K 17/972* (2006.01)
*G06F 3/02* (2006.01)
*G06F 1/16* (2006.01)

(52) U.S. Cl.
CPC ............ *H03K 17/972* (2013.01); *G06F 1/1616* (2013.01); *G06F 1/1666* (2013.01); *G06F 3/0221* (2013.01)

(58) Field of Classification Search
CPC ... G06F 1/1616; G06F 1/1666; G06F 3/0221; H03K 17/972
See application file for complete search history.

(56) References Cited

U.S. PATENT DOCUMENTS

| 4,283,714 | A | 8/1981 | Trenkler et al. |
| 6,019,530 | A | 2/2000 | Lanzetta et al. |
| 8,102,647 | B2 | 1/2012 | Bhutani et al. |
| 8,104,979 | B2 | 1/2012 | Chien et al. |
| 2004/0238710 | A1 | 12/2004 | Hsu |
| 2009/0135554 | A1 | 5/2009 | Chien et al. |
| 2011/0304550 | A1 | 12/2011 | Jolliff et al. |
| 2012/0021619 | A1 | 1/2012 | Bilbrey et al. |
| 2012/0268384 | A1 | 10/2012 | Peterson et al. |

OTHER PUBLICATIONS

"Levitatr Retractable Keyboard," 2012, pp. 1-10, designboom.
International Search Report and Written Opinion, International Application No. PCT/US2013/020190, Date: Oct. 1, 2013, pp. 1-9.
The International Bureau of WIPO, International Preliminary Report on Patentability for PCT/US2013/020190 dated Jul. 16, 2015 (8 pages).

*Primary Examiner* — Omeed Alizada
(74) *Attorney, Agent, or Firm* — Trop, Pruner & Hu P.C.

(57) ABSTRACT

A keyboard assembly includes a plurality of keys, a key actuation mechanism to move at least one of the keys, the key actuation mechanism including an electromagnet, and a controller to selectively control the electromagnet to cause the at least one key to move between a raised position and a retracted position.

20 Claims, 7 Drawing Sheets

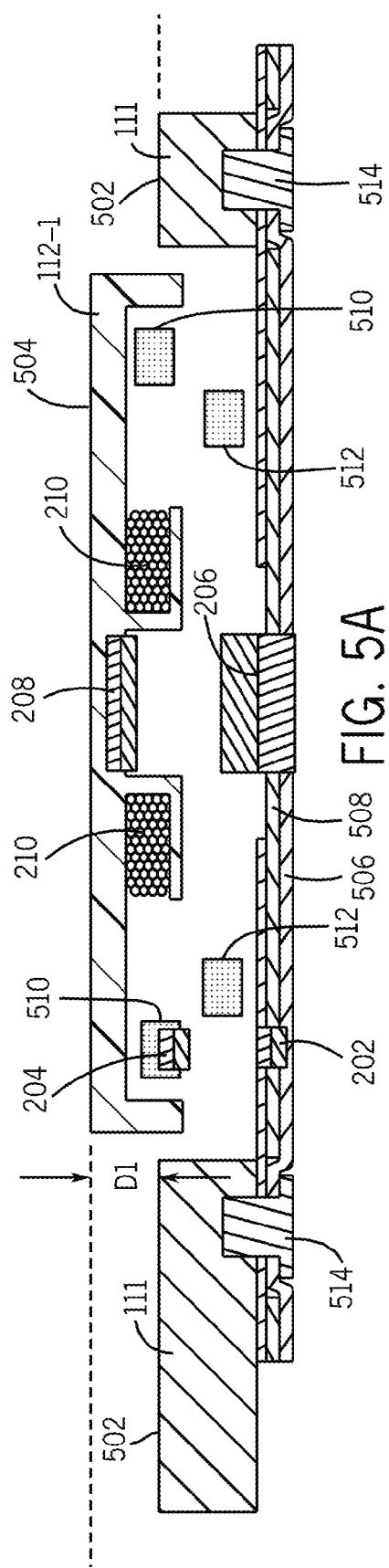
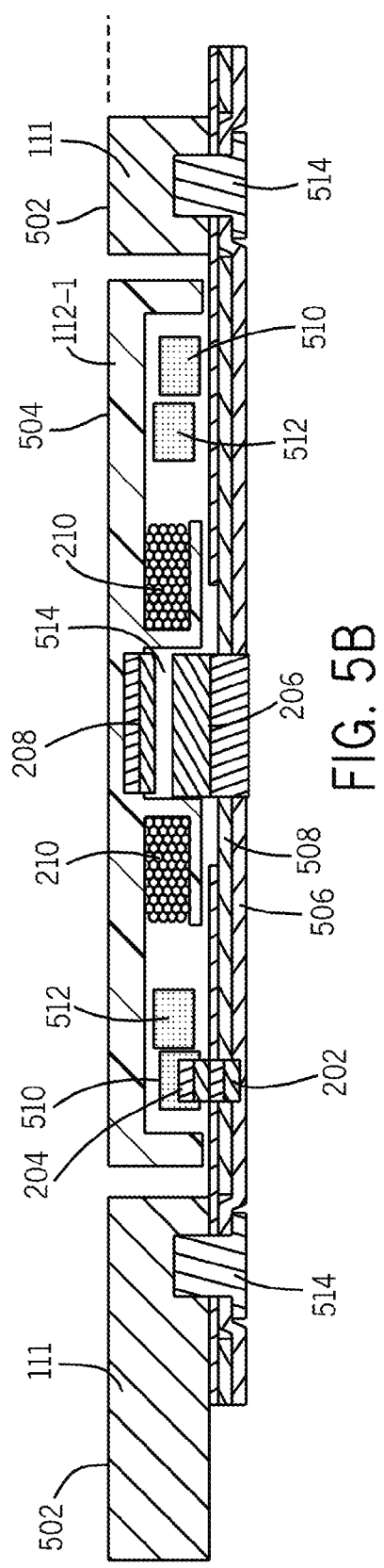

KEYBOARD ASSEMBLY INCLUDING AN ELECTROMAGNET

BACKGROUND

Certain types of portable electronic devices include keyboard assemblies that have keys to allow entry of text characters, numbers, symbols, and so forth. The keyboard assembly is associated with a certain thickness. When incorporated into a portable electronic device, the keyboard assembly can cause an increase in the overall thickness of the portable electronic device. Consequently, the presence of a keyboard assembly in a portable electronic device may restrict the ability to build a portable electronic device having a thinner profile.

BRIEF DESCRIPTION OF THE DRAWINGS

Some embodiments are described with respect to the following figures:

FIGS. 5A-5B are cross-sectional views of the keyboard assembly according to some implementations;

DETAILED DESCRIPTION

Figure 1:
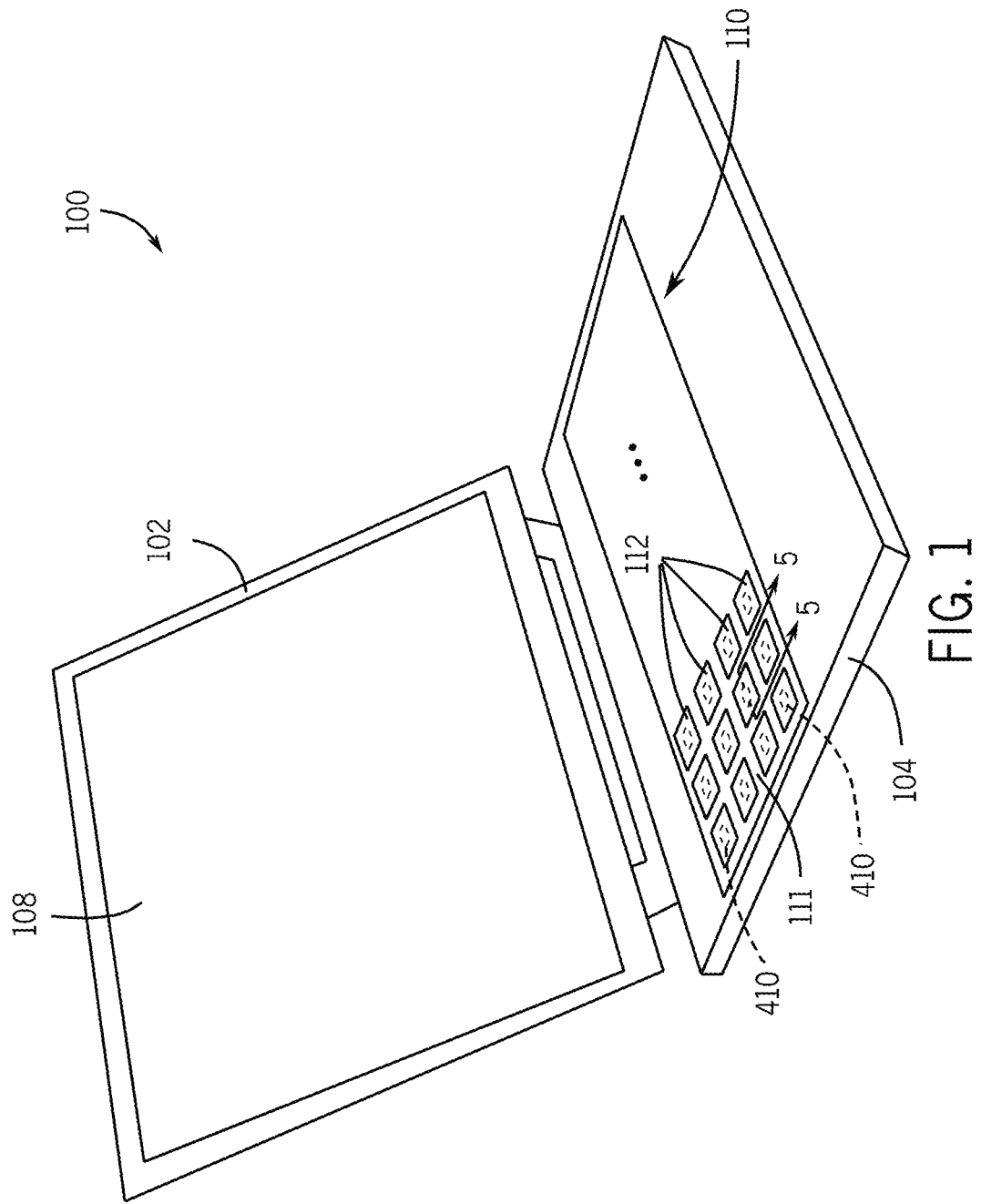
FIG. 1 is a schematic diagram of an example portable electronic device including a retractable keyboard assembly according to some implementations.

Keys of a keyboard assembly that can be used in a portable electronic device can be actuated to move between a first position (raised position) and a second position (retracted position). In use, a user's finger can press on a key to cause the key to move from its raised position to a retracted position. Release of the key allows the key to return to its raised position. In the ensuing discussion, reference is made to a "vertical" travel distance of a key of a keyboard assembly, where this vertical travel distance allows the key to travel between the raised position and the retracted position. Note that reference to "vertical" is for ease of explanation, as the travel direction can have a different orientation depending upon the orientation of the portable electronic device, and/or upon the relative orientation of the keyboard assembly to the portable electronic device.

Examples of portable electronic devices include the following: a notebook computer, a convertible tablet computer (where the computer is convertible between a notebook computer and a tablet computer), a personal digital assistant (PDA), a smartphone, a game appliance, and so forth. Although reference is made to a keyboard assembly that is to be used in a portable electronic device, it is noted that in other implementations, the keyboard assembly can be part of a standalone keyboard.

To provide tactile feedback to a user when actuating the keys of the keyboard assembly, the keys can be designed to move a certain distance between the raised position and retracted position of each key. In the raised position, a key of the keyboard assembly is raised above a frame of the keyboard assembly. The overall thickness of the keyboard assembly includes a thickness of portions of the keys that are raised above the frame.

A portable electronic device that includes a keyboard assembly has to accommodate the overall thickness of the keyboard assembly, and thus, the presence of the keyboard assembly may restrict a manufacturer's ability to reduce the thickness of the portable electronic device to achieve a thinner profile. For example, if the portable electronic device is a notebook computer that has a lid (such as a lid that contains a display panel) that can be pivoted between an open position and a closed position, some amount of space has to be provided when the lid is at the closed position between the lid's inner surface and to the keys to accommodate the keys being in the raised position when not in use. In other words, when the lid is closed against the base of the notebook computer, the space should be provided such that the inner surface of the lid should not press down on the upper surface of the keys in the raised position.

In accordance with some implementations, to allow the overall thickness of a portable electronic device that incorporates a keyboard assembly to be reduced, a key actuation mechanism including an electromagnet can be provided that is selectively controlled to control positions of keys of the keyboard assembly. Under certain conditions, the keys of the keyboard assembly can be moved by the key actuation mechanism to their retracted position to reduce the thickness profile of the keyboard assembly. In examples where the portable electronic device is a notebook computer having a lid that is pivotably attached to a base, moving the keys to their respective retracted positions allows the overall thickness of the notebook computer when the lid is in its closed position to be thinner as compared to traditional designs in which the keys of a keyboard assembly remain in their raised position even when the lid is closed.

A key actuation mechanism to selectively control retraction of keys of the keyboard assembly can be used in other types of portable electronic devices. Such a key actuation mechanism can also be used in a standalone keyboard.

FIG. 1 is a perspective view of a notebook computer 100 that has a lid 102 and a base 104. The lid 102 is pivotably attached to the base 104 using at least one hinge assembly 106. In the example of FIG. 1, the lid 102 can include a display panel 108, and the base 104 can include a keyboard assembly 110. The keyboard assembly 110 has various keys 112 that can travel along a vertical travel distance between a raised position and a retracted position. Each of at least some of the keys 112 is associated with a respective electromagnet 410 (discussed further below). When the lid 102 is moved to its closed position, the keys 112 are caused to be retracted using a key actuation mechanism according to some implementations.

The keys 112 of the keyboard assembly 110 are mounted in a keyboard frame 111. The keyboard frame 111 has openings to receive the respective keys 112. When the keys 112 are in their raised position, the keys 112 protrude above the upper surface of the keyboard frame 111. When the keys 112 are in their retracted position, the upper surfaces of the keys 112 are flush (or even below) the upper surface of the keyboard frame 111.

In some implementations, closing of the lid 102 of the notebook computer 100 triggers retraction of the keys 112 to their retracted position. In other examples, other events can cause retraction of the keys 112 to their retracted position. For example, such other events can include any or some combination of the following: detection of use of the display panel 108 as a touchscreen display (where a user touches the touchscreen display to make user inputs to the notebook computer 100); a command from an application executing in the notebook computer 100 to cause retraction of at least a subset of the keys 112; or any other event.

In alternative examples, the notebook computer 100 can be a convertible computer that can convert between a first configuration and a second configuration. In the first configuration, the convertible computer 100 is used as a traditional notebook computer in which the keyboard assembly 110 is used for inputting data to the notebook computer 100. In the second configuration, the convertible computer 100 can be used as a tablet computer, where user input is made through a touchscreen display (e.g. display panel 108). To achieve the second configuration, the lid 102 of FIG. 1 can be rotated such that the display panel 108 faces upwardly, to allow the display panel 108 to be used as a touch-sensitive display panel.

Figure 2:
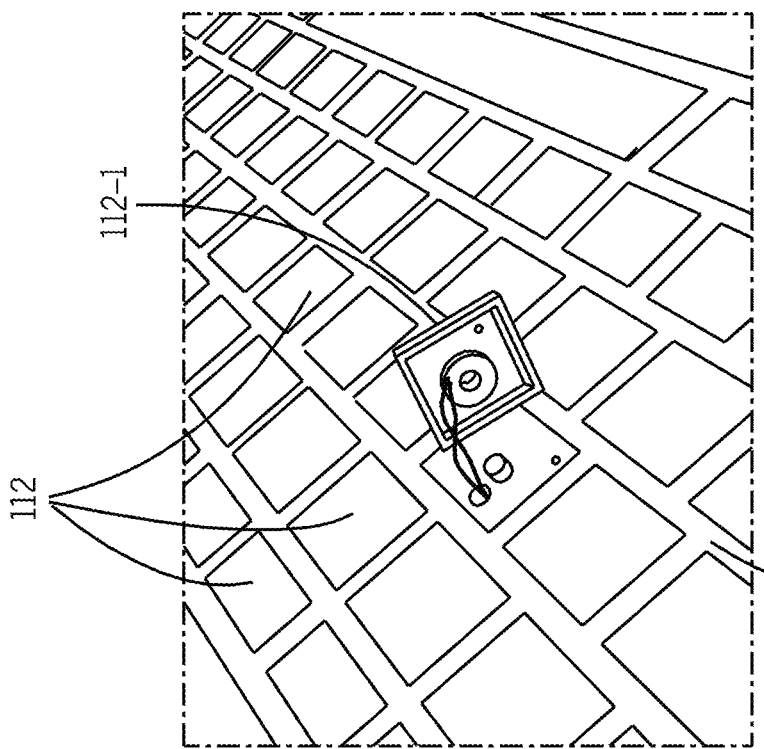

FIG. 2 is an enlarged perspective view of a portion of the keyboard assembly 110 of FIG. 1, with one of the keys (112-1) partially removed to illustrate components that are usable for selectively moving the key 112-1 between a raised position and a retracted position. Similar components can be used for the other keys 112 of the keyboard assembly 110.

Figure 3:
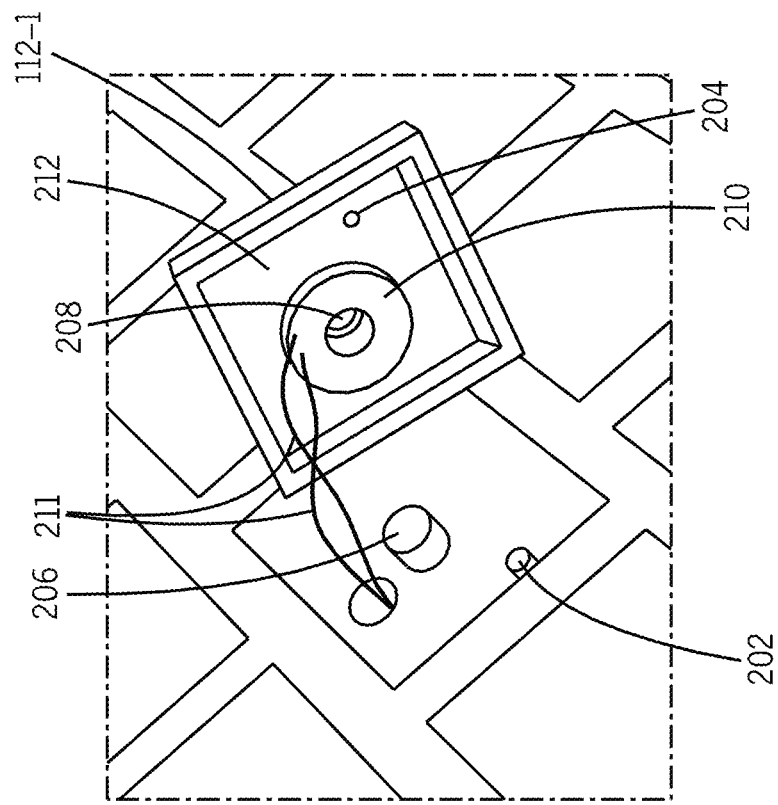
FIGS. 2 and 3 are enlarged perspective views of portions of a keyboard assembly with one of the keys partially removed to illustrate a portion of a key actuation mechanism that includes an electromagnet according to some implementations.

FIG. 3 shows a further enlarged view of the components associated with the key 112-1. In examples according to FIGS. 2 and 3, magnets can be used for positioning the key 112-1 in its raised position or retracted position. The magnets include magnets 202 and 206 provided on a base of the keyboard assembly 110. The base of the keyboard assembly 110 includes an underlying structure that support the keys 112 of the keyboard assembly 110.

In addition, magnets 204 and 208 are provided in the inner surface 212 of the key 112-1. The magnets 202 and 204 form a first magnet pair, and the magnets 206 and 208 form a second magnet pair. In some examples, the magnet pair 202, 204 is an attractive magnet pair, in which the magnets are oriented such that they are attracted to each other. The magnet pair 206, 208 can be a repulsive magnet pair, in which the magnets 206 and 208 are oriented such that they repulse each other. In other examples, the magnet pair 202, 204 can be a repulsive magnet pair, while the magnet pair 206, 208 can be an attractive magnet pair.

In addition, an electromagnet that includes a coil 210 can also be provided in the inner surface 212 of the key 112-1. The coil 210 has an electrical conductor 211 through which an electrical current can be passed. The electrical conductor 211 (which can be part of an electrical wire) can be wound in the coil 210. The combination of the coil 210 and a core of ferromagnetic material (such as iron or other ferromagnetic material) forms the electromagnet according to some implementations. In the example of FIG. 3, the coil 210 and the ferromagnetic material of the magnets 206, 208 collectively form the electromagnet. In other implementations, instead of forming the electromagnet with the coil 210 and the ferromagnetic material of the magnets 206, 208, a separate ferromagnetic core can be provide that in combination with the coil 210 forms the electromagnet.

The magnetic field produced by the electromagnet depends upon a direction of current flow through the electrical conductor 211. If the electrical current flows in the electrical conductor 211 in a first direction, then a magnetic field in a first direction is produced by the electromagnet. On the other hand, if a reverse electrical current is passed through the electrical conductor 211, then a magnetic field in a second, opposite direction is produced by the electromagnet. Moreover, if no current is passed through the electrical conductor 211 of the electromagnet, then no magnetic field is produced by the electromagnet.

Depending upon the direction of current flow through the electrical conductor 211, the electromagnet can be controlled to either produce an attractive force with respect to the magnet 206, or to produce a repulsive force with respect to the magnet 206. Thus, depending upon the magnetic field produced by the electromagnet, the electromagnet can either work with the magnet 208 or against the magnet 208.

The selective control of the magnetic field produced by the electromagnet can control movement of the key 112-1 between the raised position and the retracted position. For example, if the key 112-1 is initially in the raised position, the electromagnet can be controlled to produce a magnetic field that causes attraction between the electromagnet and the magnet 206, which results in the key 112-1 being moved from the raised position to the retracted position. Note that the attractive force produced between the electromagnet and the magnet 206 is opposite the repulsive force between the magnet 208 and the magnet 206. However, the attractive force between the electromagnet and the magnet 206 is greater than the repulsive force between the magnets 206 and 208 such that the key 112-1 is moved to its retracted position.

Once the key 112-1 has moved to its retracted position, the magnets 202 and 204 of the attractive magnet pair are brought in close proximity to (or in contact with) each other such that they can maintain the key 112-1 in the retracted position.

The production of the magnetic field by the electromagnet to produce the attractive force between the electromagnet and the magnet 206 is in response to an electrical current pulse through the electrical conductor 211. The electrical current pulse is of a sufficient time duration to allow time for the key 112-1 to travel from the raised position to the retracted position. Once the key 112-1 has reached its retracted position, and the magnets 202 and 204 can act to maintain the retracted position of the key 112-1, electrical current can be removed from the electromagnet such that the electromagnet no longer produces a magnetic field. In this way, a continuous electrical current does not have to be maintained through the electromagnet, which reduces power consumption.

At a later time, if it is desired to move the key 112-1 from the retracted position to the raised position, an opposite electrical current pulse can be passed through the electrical conductor 211 of the electromagnet to cause the electromagnet to produce a magnetic field that results in the electromagnet being repulsed from the magnet 206. This repulsive force between the electromagnet and the magnet 206 is in addition to the repulsive force provided by the repulsive magnet pair 206, 208. The combined repulsive force can overcome the attractive force of the attractive magnet pair 202, 204. As a result, the key 112-1 is moved from the retracted position to the raised position. Once the key 112-1 is raised to the raised position, the repulsive force provided by the repulsive magnet pair 206, 208 is sufficient to maintain the raised position of the key 112-1. As a result, electrical current can be removed from the electrical conductor 211 such that the electromagnet no longer produces a magnetic field.

Although FIGS. 2 and 3 depict the coil 210 of the electromagnet being attached to the inner surface 212 of the key 112-1, the coil 210 can be provided on the base (or even underneath the base) of the keyboard assembly in other implementations.

Also, the locations of the various magnets 202, 204, 206, 208, and the coil 210 can be different in other examples.

Figure 4:
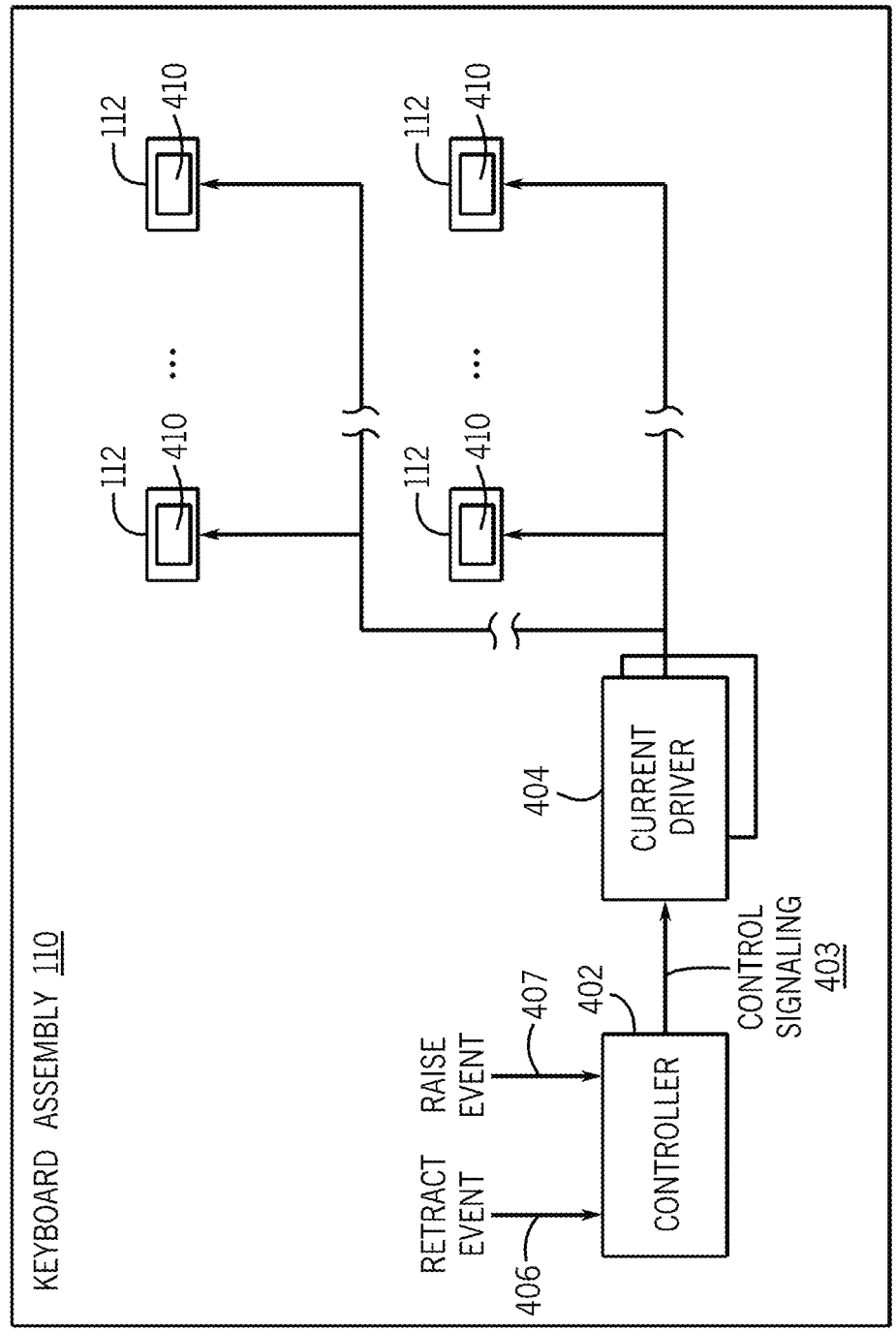
FIG. 4 is a schematic diagram of a keyboard assembly according to some implementations.

FIG. 4 is a schematic diagram of components of an example keyboard assembly 110. The keyboard assembly 110 includes a controller 402, which can be a keyboard controller that interacts with the keys 112 of the keyboard assembly 110 for detecting user actuation of the keys 112. Alternatively, the controller 402 can be separate from the keyboard controller. The controller 402 outputs control signaling 403 to control one or multiple current drivers 404. A current driver 404 drives an electrical current to one or multiple ones of electromagnets 410 associated with respective keys 112. Each electromagnet 410 can include the coil 210 of FIG. 3 and a ferromagnetic core (such as that provided by the magnets 206, 208). In some examples, one current driver 404 can drive an electrical current to multiple electromagnets 410. In other examples, one current driver 404 can drive an electrical current to an individual electromagnet 410.

More generally, a current driver 404 can control actuation of all the keys 112 or a subset of the keys 112, where the subset can include just one individual key 112 or multiple keys 112 that are less than the entirety of all of the keys 112.

The electromagnets 410 and the magnets 202, 204, 206, and 208 are part of a key actuation mechanism. The key actuation mechanism can be controlled by the controller 402.

The controller 402 receives inputs that are referred to as a retract event 406 and raise event 407. Each of the retract event 406 and raise event 407 can be represented by a signal or a combination of signals that are connected to an input pin or multiple input pins of the controller 402. Alternatively, each of the retract event 406 and raise event 407 can be in the form of a command or other information that can be written to a control register in the controller 402 to cause the controller 402 to perform a requested task.

Generally, the retract event 406 is provided to the controller 402 to cause the controller 402 to retract at least a subset of the keys 112. The retract event 406 can correspond to closing of the lid 102 (FIG. 1), use of the display panel 108 of the notebook computer 100 as a touchscreen, a command from an application, and so forth. The raise event 407 is provided to the controller 402 to cause the controller 402 to raise at least a subset of the keys 112. The raise event 407 can correspond to opening of the lid 102, cessation of use of the display panel 108 as a touchscreen, another command from the application, and so forth.

FIGS. 5A-5B are cross-sectional views of a portion of the keyboard assembly 110. The specific portion depicted can be the portion corresponding to the key 112-1 of FIGS. 2 and 3, and is identified by section 5-5 in FIG. 1.

In FIG. 5A, the key 112-1 is in its raised position, such that it is raised or protrudes above the upper surface 502 of the keyboard frame 111 (which can be formed of a metal or other material). In the raised position, an upper surface 504 of the key 112-1 is a distance D1 above the upper surface 502 of the keyboard frame 111.

In FIG. 5B, the key 112-1 is in its retracted position, such that the upper surface 504 of the key 112-1 is generally at the same height as the upper surface 502 of the keyboard frame 111. In other words, the upper surface 504 of the key 112-1 is flush with the upper surface 502 of the keyboard frame 111. In other examples, when the key 112-1 is in its retracted position, the upper surface 504 of the key 112-1 can be below the upper surface 502 of the keyboard frame 111.

As a result, it can be seen from FIGS. 5A and 5B that the overall thickness of the keyboard assembly 110 can be reduced by D1 if the keys 112 of the keyboard assembly 110 are retracted to the retracted position, as shown in FIG. 5B.

The base of the keyboard assembly 110 includes an underlying support frame 506 (which can be formed of a metal of other material). The underlying support frame 506 can be attached by an attachment mechanism 514 (e.g. screws) to the keyboard frame 111.

In addition, a flexible circuit board 508 can be provided on the underlying support frame 506. The flexible circuit board 508 includes electrical conductors for carrying signals relating to detected actuations of keys 112 of the keyboard assembly 110. For example, a specific electrical conductor of the flexible circuit board 508 can carry a signal that indicates when a particular key of the keyboard assembly 110 has been depressed by a user.

As further depicted in FIG. 5A, magnets 202 and 204 are arranged such that the N and S pole orientations of the magnets 202 and 204 are the same. As a result, the S pole of the magnet 204 faces the N pole of the magnet 202, or vice versa, which results in the magnets 202 and 204 being attracted to each other. The magnet 202 is provided on the underlying support frame 506, while the magnet 204 is attached to an arm structure 510 of a key assembly that includes the key 112-1.

The arm structure 510 can be operatively coupled to an arm structure 512 to allow for relative motion between the key 112-1 and the keyboard frame 111.

The magnets 206 and 208 are arranged in opposite orientations, such that the S pole of the magnet 208 faces the S pole of the magnet 206 (or alternatively, the N pole of the magnet 208 faces the N pole of the magnet 206), which results in the magnets 206 and 208 repulsing each other.

When the key 112-1 is in its retracted position, the magnet 204 is brought down to be in contact with the magnet 202 (or alternatively, in close proximity to the magnet 202). The magnet 208 is also brought down to be in closer proximity to the magnet 206. However, a gap 514 between the magnets 206 and 208 (when the key 112-1 is in the retracted position) is greater than the gap (assuming there is any gap) between the magnets 202 and 204. As a result, the attractive force of the magnets 202 and 204 is greater than the repulsive force of the magnets 206 and 208, which allows the key 112-1 to remain in its retracted position as shown in FIG. 5B.

The key 112-1 can be moved from its raised position (FIG. 5A) to its retracted position (FIG. 5B) in one of two different ways. In the first way, a user's finger can press the key 112-1 downwardly to move the key 112-1 from the raised position to the retracted position. In a second way, the controller 402 of FIG. 4 can cause an electrical current to be passed through the electromagnet 410 (FIG. 4) to produce a magnetic field that causes attraction between the electromagnet 410 and the magnet 206. This causes the key 112-1 to be pulled downwardly to the retracted position. When the current through the electromagnet 410 is stopped, the attraction of the magnets 202 and 204 allow the key 112-1 to remain in its retracted position (FIG. 5B).

To cause the key 112-1 to return to its raised position, an electrical current can be run through the electromagnet 410 in an opposite direction, which causes repulsion between the electromagnet 410 and the magnet 206. This repulsion produced between the electromagnet 410 and the magnet 206 can overcome the attractive force of the magnets 202 and 204, which pushes the key 112-1 to its raised position (FIG. 5A).

As noted above, the retraction of the keys 112 of the keyboard assembly 110 can be performed in response to closing of the lid of the notebook computer 100, for example. In other examples, the keys 112 of the keyboard assembly 110 can be performed in response to other events. For example, if the notebook computer 100 detects that the user is using the portable computer 100 in its touchscreen configuration, then the keys 112 can be retracted to enhance user convenience, since the keys are moved out of the way to avoid inadvertent user actuation of the keys 112 during use of the display panel 108 of FIG. 1 for touchscreen input.

Figure 6:
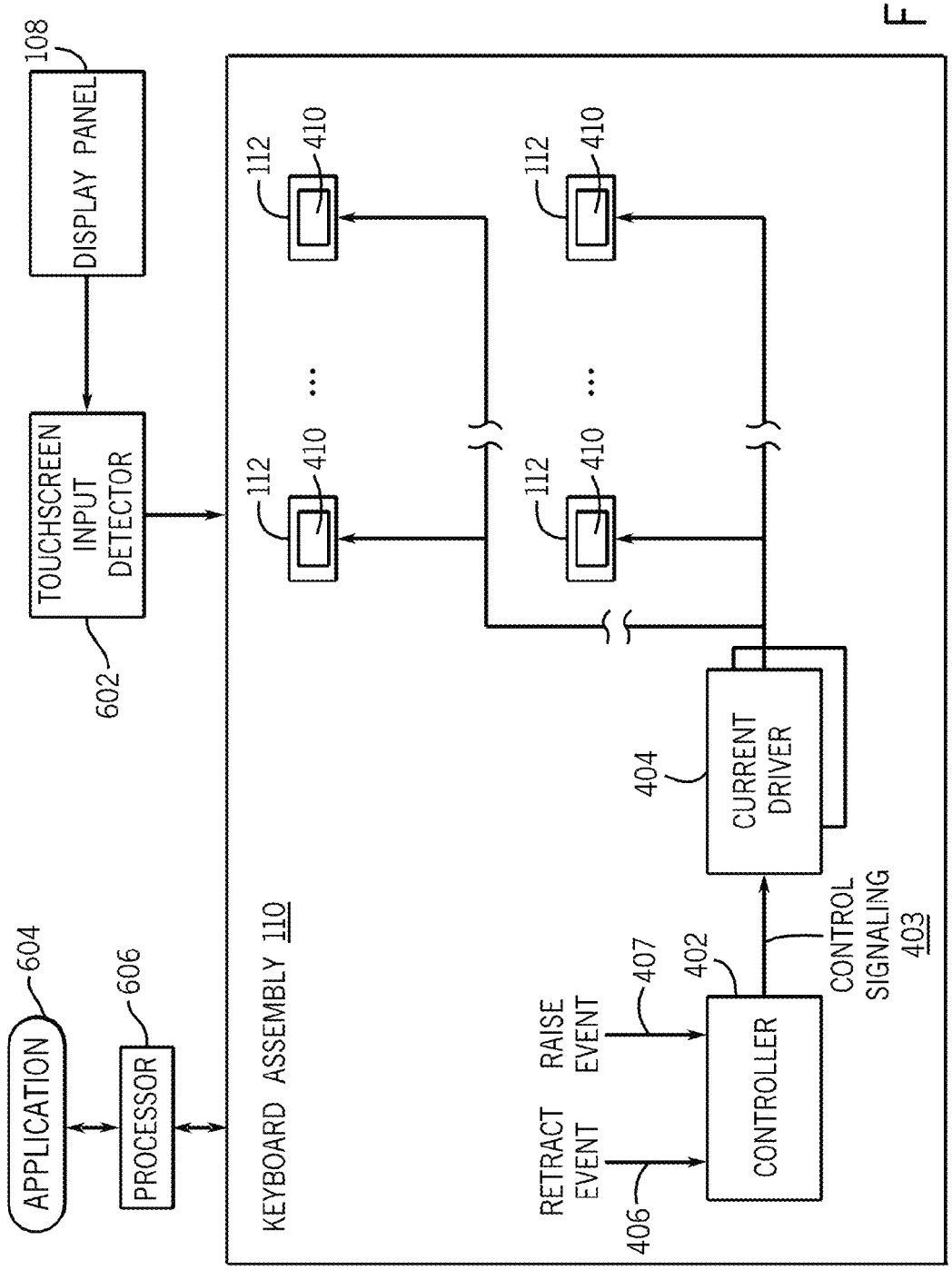
FIG. 6 is a schematic diagram of a portion of a portable electronic device that includes the keyboard assembly, in accordance with alternative implementations.

As shown in FIG. 6, a touchscreen input detector 602 can receive an indication from the touch-sensitive display panel 108 that touchscreen input has been received at the display panel 108. In response to receiving the indication, the touchscreen input detector 602 can generate an output to the keyboard assembly 110 to provide the retract event 406 to the keyboard assembly 110. When the touchscreen input detector 602 detects that touchscreen input is no longer received at the touch-sensitive display panel 108 (such as after some timeout period or based on a user input indicating such), the touchscreen input detector 602 can provide the raise event 407 to raise the keys 112.

In other examples, the retraction of the keys 112 can be performed under control of an application (or more generally machine-readable instructions) executed in a portable electronic device. For example, FIG. 6 shows an application 604 executable on one or multiple processors 606. The application 604 can issue commands to the controller 402 to cause the controller 402 to perform selective retraction of at least a subset of the keys 112 of the keyboard assembly 100. For example, the application 604 can be a gaming application, in which only certain keys of the keyboard assembly 110 are used for performing game functions. The application 604 can instruct the controller 402 to retract a first subset of the keys 112, while maintaining a second subset of the keys 112 in their raised positions to allow for user actuation of the keys in the second subset.

Note that actuation of keys 112 of the keyboard assembly 110 by a user can be communicated to the processor(s) 606, for entering information or controlling the application 604, for example.

The selective retraction of just a subset (less than all) of the keys 112 can be performed in other examples. Different subsets of the keys 112 can be retracted for different contexts (such as different uses of a portable electronic device, different applications running in the portable electronic device, etc.).

Although FIGS. 2, 3, and 5A-5B illustrate use of two pairs of magnets in addition to the electromagnet in the key actuation mechanism of the keyboard assembly 110, it is noted that in alternative implementations, one or both pairs of the magnets (magnet pair 202, 204 and/or magnet pair 206, 208) can be replaced with a different mechanism for setting a position of a key 112. For example, the attractive magnet pair 202, 204 can be replaced with a spring that pulls the key 112-1 toward the keyboard assembly base, but is counteracted by the repulsive force of the repulsive magnet pair 206, 208. Alternatively, the repulsive magnet pair 206, 208 can be replaced with a spring that biases the key 112-1 at its raised position. The electromagnet when activated can be used to overcome the biasing force of the spring.

Figure 7:
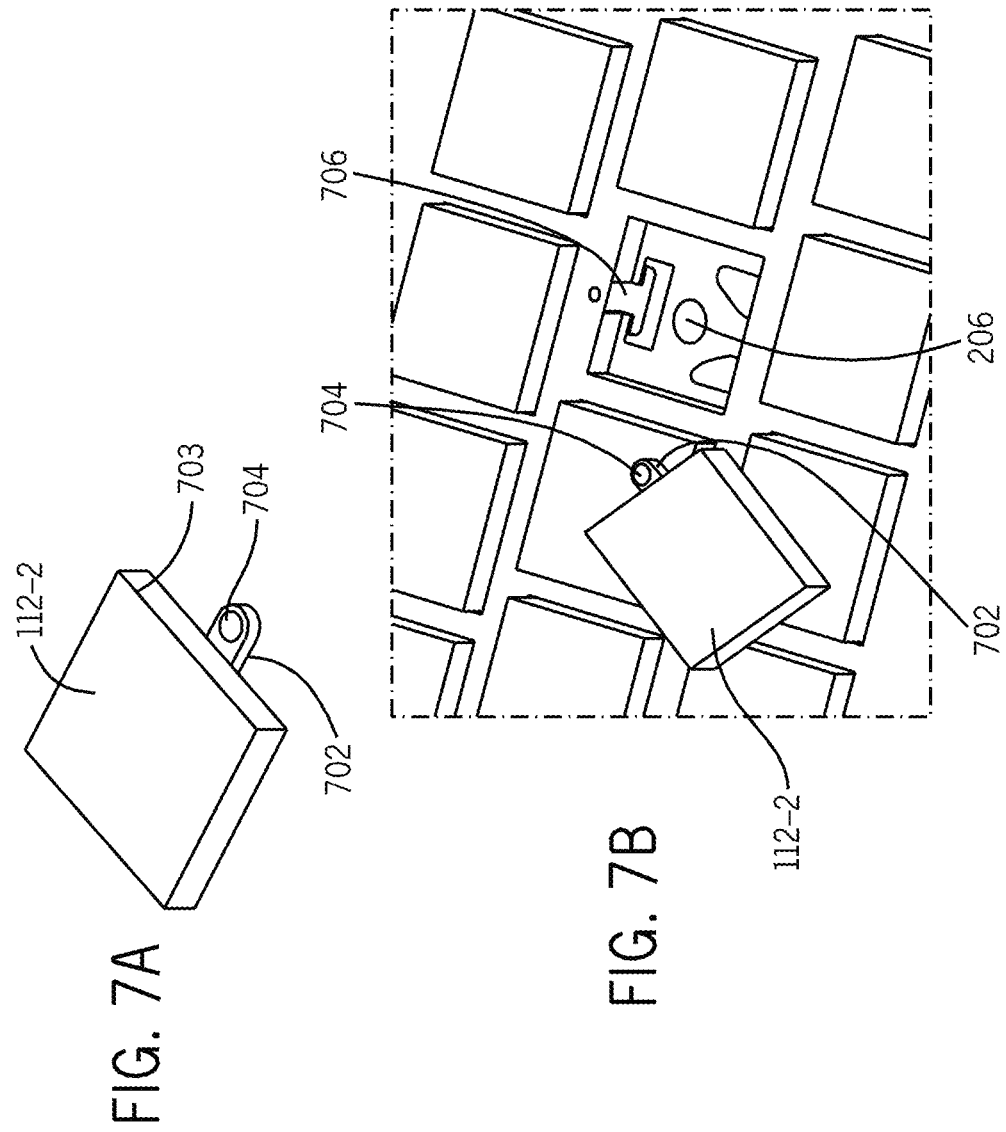
FIGS. 7A-7B depict a key and a portion of a keyboard assembly according to further alternative implementations.

As noted above, the positions of the magnets 202, 204, 206, 208, and coil 210 can be different from the positions of FIGS. 2, 3, and 5A-5B in other examples. As an example of a different arrangement, FIGS. 7A-7B depict a key 112-2 that has a tab 702 on which a magnet 704 is provided. The tab 702 protrudes sideways from a side 703 of the key 112-2.

The tab 704 is designed to be provided in a receptacle 706 (FIG. 7B) in the keyboard frame 111. Although not depicted in FIG. 7B, a corresponding magnet can be provided at the base of the keyboard assembly 110 of FIG. 7B. This magnet pair that includes the magnet 704 and the corresponding magnet at the base of the keyboard assembly 110 can replace the magnet pair 202, 204 shown in FIGS. 2 and 3, for example. FIG. 7B also shows the magnet 206 that forms the other magnet pair 206, 208 as depicted in FIGS. 2 and 3.

As further alternative examples, instead of providing the coil 210 and the magnet pair 206, 208 near the center region of the key 112-2 (as shown in FIGS. 2 and 3), the coil 210 and the magnet pair 206, 208 can be offset to one side of the key 112-2. The benefit of offsetting these magnets is that backlighting can be provided through the key 112-2. Backlighting is accomplished by providing a backlight source in the keyboard assembly 110, where light produced by the backlight source can be visible through a translucent portion of each of each key 112-2.

Figure 8:
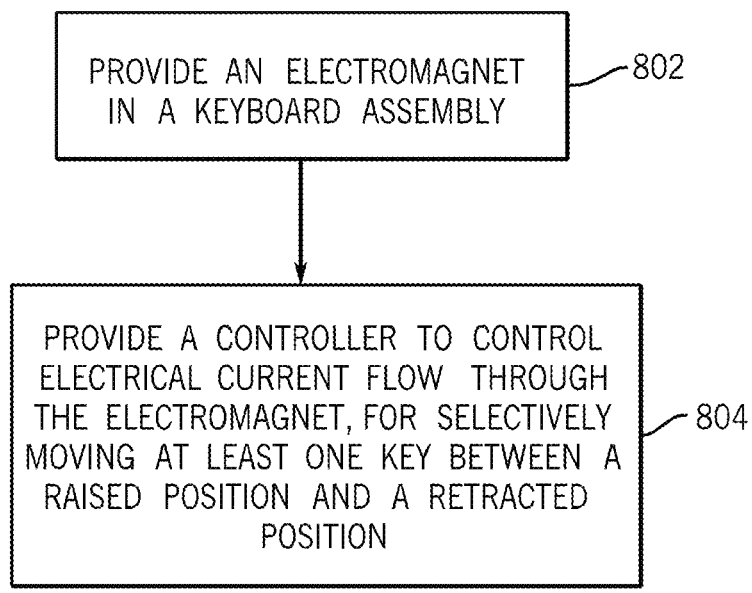
FIG. 8 is a flow diagram of a process of providing a keyboard assembly according to some implementations.

FIG. 8 is a flow diagram of a process of providing (e.g. making, assembling, etc.) a keyboard assembly according to some implementations. The process includes providing (at 802) an electromagnet in the keyboard assembly. The process further includes providing (at 804) a controller to control electrical current flow through the electromagnet. The controller controls a direction of the electrical current flow to selectively move at least one key of the plurality of keys between a raised position and a retracted position.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A keyboard assembly comprising:
    a plurality of keys;
    a key actuation mechanism comprising an electromagnet to move at least one of the keys, the key actuation mechanism further comprising a first magnet and a second magnet; and
    a controller to:
        apply a first electrical current to the electromagnet to cause the at least one key to move from a raised position to a retracted position; and
        remove the first electrical current from the electromagnet once the at least one key has moved from the raised position to the retracted position, wherein after removal of the first electrical current the first magnet and the second magnet are to apply an attractive force to maintain the at least one key at the retracted position.

2. The keyboard assembly of claim 1, further comprising a frame in which the keys are arranged,
    wherein when the at least one key is in the raised position, a portion of the at least one key is protruding above an upper surface of the frame.

3. The keyboard assembly of claim 2, wherein when the at least one key is in the retracted position, an upper surface of the at least one key is flush with or below the upper surface of the frame.

4. The keyboard assembly of claim 1, wherein the controller is to cause the retraction of the at least one key in response to detecting an event.

5. The keyboard assembly of claim 4, wherein the event is in response to closing a lid of an electronic device.

6. The keyboard assembly of claim 4, wherein the event is in response to receiving touchscreen input at a touch-sensitive display panel of an electronic device.

7. The keyboard assembly of claim 1, wherein the controller is to cause retraction of at least a first subset of the keys to the retracted position in response to instruction from an application executing in an electronic device.

8. The keyboard assembly of claim 7, wherein the controller is to maintain a second subset of the keys in the raised position while the first subset of the keys are in the retracted position.

9. The keyboard assembly of claim 1, further comprising a current driver to drive an electrical current through an electrical conductor of the electromagnet, wherein the current driver is to control a direction of current flow through the electrical conductor in response to control signaling from the controller.

10. The keyboard assembly of claim 1, wherein the first and second magnets form an attractive magnet pair, wherein the key actuation mechanism further comprises a repulsive magnet pair, and wherein the controller is to:
apply, to the electromagnet, a second electrical current that flows in a direction opposite to a direction of the first electrical current, the applied second electrical current to cause the electromagnet to produce a repulsive force to overcome the attractive force of the attractive magnet pair to move the at least one key from the retracted position to the raised position; and
after the at least one key has moved from the retracted position to the raised position, remove the second electrical current from the electromagnet, wherein after removal of the second electrical current the repulsive magnet pair is to apply a repulsive force to maintain the at least one key at the raised position.

11. The keyboard assembly of claim 10, wherein the at least one key has a protruding tab on which one of magnets of the attractive magnet pair is provided.

12. A method comprising:
controlling, by a controller, an electromagnet in a keyboard assembly having a plurality of keys, to selectively move a first key of the plurality of keys between a raised position and a retracted position, the keyboard assembly further comprising an attractive magnet pair, the controlling comprising:
applying a first electrical current to the electromagnet to produce a force to move the first key from the raised position to the retracted position; and
removing the first electrical current from the electromagnet once the first key has moved from the raised position to the retracted position, wherein after removal of the first electrical current the attractive magnet pair applies an attractive force that maintains the first key at the retracted position.

13. The method of claim 12, wherein the keyboard assembly further comprises a repulsive magnet pair, wherein the controlling further comprises:
applying, to the electromagnet, a second electrical current that flows in a direction opposite to a direction of the first electrical current, the applied second electrical current causing the electromagnet to produce a repulsive force to overcome the attractive force of the attractive magnet pair to move the first key from the retracted position to the raised position; and
after the first key has moved from the retracted position to the raised position, removing the second electrical current from the electromagnet, wherein after removal of the second electrical current the repulsive magnet pair applies a repulsive force to maintain the first key at the raised position.

14. An electronic device comprising:
at least one processor; and
a keyboard assembly coupled to the at least one processor and having a controller, a key actuation mechanism, and a plurality of keys that are selectively retractable by the key actuation mechanism under control of the controller, the key actuation mechanism including an electromagnet to selectively produce magnetic fields of different directions based on the control of the controller,
the key actuation mechanism further comprising a first magnet and a second magnet, the controller to:
apply a first electrical current to the electromagnet to produce a force to move a first key of the plurality of keys from a raised position to a retracted position; and
remove the first electrical current from the electromagnet once the first key has moved from the raised position to the retracted position, wherein after removal of the first electrical current the first magnet and the second magnet are to apply an attractive force that maintains the first key at the retracted position.

15. The electronic device of claim 14, further comprising an application executable on the at least one processor to instruct the controller to retract at least a subset of the plurality of the keys to the retracted position.

16. The keyboard assembly of claim 10, wherein the first electrical current applied to the electromagnet is to produce an attractive force to overcome the repulsive force of the repulsive magnet pair, to move the at least one key from the raised position to the retracted position.

17. The keyboard assembly of claim 16, wherein the repulsive force responsive to the second electrical current applied to the electromagnet works together with the repulsive force of the repulsive magnet pair to move the at least one key from the retracted position to the raised position.

18. The method of claim 13, wherein the first electrical current applied to the electromagnet produces an attractive force to overcome the repulsive force of the repulsive magnet pair, which moves the first key from the raised position to the retracted position.

19. The method of claim 18, wherein the repulsive force responsive to the second electrical current applied to the electromagnet works together with the repulsive force of the repulsive magnet pair to move the first key from the retracted position to the raised position.

20. The electronic device of claim 14, wherein the first and second magnets form an attractive magnet pair, wherein the keyboard assembly further comprises a repulsive magnet pair, and wherein the controller is to:
apply, to the electromagnet, a second electrical current that flows in a direction opposite to a direction of the first electrical current, the applied second electrical current causing the electromagnet to produce a repulsive force to overcome the attractive force of the attractive magnet pair to move the first key from the retracted position to the raised position; and
after the first key has moved from the retracted position to the raised position, remove the second electrical current from the electromagnet, wherein after removal of the second electrical current the repulsive magnet pair is to apply a repulsive force to maintain the first key at the raised position,
wherein the first electrical current applied to the electromagnet produces an attractive force to overcome the repulsive force of the repulsive magnet pair, to move the first key from the raised position to the retracted position.

* * * * *